United States Patent [19]

Suzuki et al.

[11] Patent Number: 4,617,471
[45] Date of Patent: Oct. 14, 1986

[54] IMAGE SENSING DEVICE

[75] Inventors: Kouhei Suzuki, Yokohama; Tamio Saito, Oume; Ken-ichi Mori, Yokohama, all of Japan

[73] Assignee: Kabushiki Kaisha Toshiba, Kawasaki, Japan

[21] Appl. No.: 681,657

[22] Filed: Dec. 14, 1984

[30] Foreign Application Priority Data

Dec. 27, 1983 [JP] Japan .................. 58-246375
Mar. 31, 1984 [JP] Japan .................. 59-63525

[51] Int. Cl.⁴ ............................................. H01J 40/14
[52] U.S. Cl. .................................. 250/578; 357/68; 361/406
[58] Field of Search .................. 250/578; 357/32, 68; 361/406

[56] References Cited

U.S. PATENT DOCUMENTS 4,475,119 10/1984 Kuo et al. .................. 357/68 X
4,574,160 3/1986 Cull et al. .................. 357/68 X
4,575,745 3/1986 Sharma et al. .................. 357/68 X

OTHER PUBLICATIONS

IEDM 1982 Tech. Dig., "Amorphous SiiH Contact Linear Image Sensor with Si₃N₄ Blocking Layer"; S. Kaneko et al., 1982.
Proc. of IMC 1982 (Tokyo), "Design and Evaluation of A4 Amorphous Si Hybrid Image Sensor"; T. Ozawa et al., 1982.

Primary Examiner—Eugene R. LaRoche
Assistant Examiner—James C. Lee
Attorney, Agent, or Firm—Oblon, Fisher, Spivak, McClelland & Maier

[57] ABSTRACT

An image sensing device including an array of photovoltaic conversion elements on a substrate to convert incident light from an image plane to be read into electrical signals. The electrical signals are transferred to a plurality of signal reading circuits, which are constructed by a plurality of integrated circuits, via a plurality of conductive strips defining wiring patterns of non-uniform lengths formed on the substrate. The sums of the areas of the conductive strips with the areas of the electrodes to which the conductive strips are connected are made substantially equal in each of the electrode-conductive strip pairs to make the sums of the stray capacitances of the conductive strips and the interelectrode capacitances of the photovoltaic conversion elements substantially equal.

13 Claims, 6 Drawing Figures

IMAGE SENSING DEVICE

BACKGROUND OF THE INVENTION

1. Field of the Invention

This invention relates in general to an image sensing device and more particularly to an image sensing device whereby the image on an image plane such as a page or the like is read in the form of electrical signals using an array of photovoltaic conversion elements.

2. Description of the Prior Art

The conventional image sensor as above briefly described includes plural photovoltaic conversion elements consisting of photodiodes or non-crystalline or polycrystalline film etc., normally arranged in a row. These photovoltaic conversion elements generate electrical charges corresponding to the amount of incident light, i.e., the number of photons received from an image plane. These charges are stored in capacitances (interelectrode capacitance, stray wiring capacitance etc.). One terminal of each of photovoltaic conversion elements is connected to a power source. The other terminal of each of the elements is connected to a respective switching element which may be, for example, a MOS-FET. The switching elements are sequentially driven by a shift register so that they read out the charge signal stored in the capacitances. That is, the charge generated in the photovoltaic conversion elements is stored in the capacitances from the time when the switching elements are sequentially turned ON until they are again turned ON after completing the reading of one line, and this stored charge is read out when the corresponding switching elements have turned ON again. This charge which is read out is then extracted as the read-out output by means of a detector circuit.

However, in such an image sensor, the signal reading circuit that contains the switching elements is usually constructed of a monolithic integrated circuit such as a MOS-IC. In this case, the photovoltaic conversion elements and the integrated circuit are connected by conductive strips defining wiring patterns formed on the substrate. However, in the installation of the integrated circuit, these conductive strips will have to be of unequal length, with the result that the stray capacitances of these respective conductive strips will be unequal. As these stray capacitances of the conductive strips form part of the capacitances for storing the signal charge, the non-uniformity of these stray capacitances implies non-uniformity of these capacitances. This therefore results in the read-out output of the signal charges being non-uniform, giving rise to problems of instability of the image-reading sensitivity.

SUMMARY OF THE INVENTION

Accordingly, an object of this invention is to provide a new and improved image sensing device so constructed that the image reading output is obtained with little sensitivity instability by making the capacitances that accumulate the signal charges from the photovoltaic conversion elements uniform.

The above-noted object is achieved according to the present invention by providing a novel image sensing device including plural photovoltaic conversion elements and signal reading circuits interconnected by conductive strips to the photovoltaic conversion elements for reading signals generated by these elements, wherein the conductive strips, which define wiring patterns, are of non-uniform length and are made progressively narrower the greater the length thereof, whereby the stray capacitances of the respective conductive strips are made substantially equal.

Further, in cases where the conductive strips have non-uniform lengths but equal widths, the areas of a plurality of electrodes of the photovoltaic conversion elements are increased progressively for shorter length of the conductive strips connected thereto, whereby the sums of the stray capacitances of the conductive strips and the interelectrode capacitances of the photovoltaic conversion elements are made substantially equal.

According to the present invention, the total capacitances that accumulate the signal charges from the photovoltaic conversion elements are made substantially equal. The instability in the sensitivity of image reading can therefore be reduced, enabling reproduction of a high quality image with virtually no such instability.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
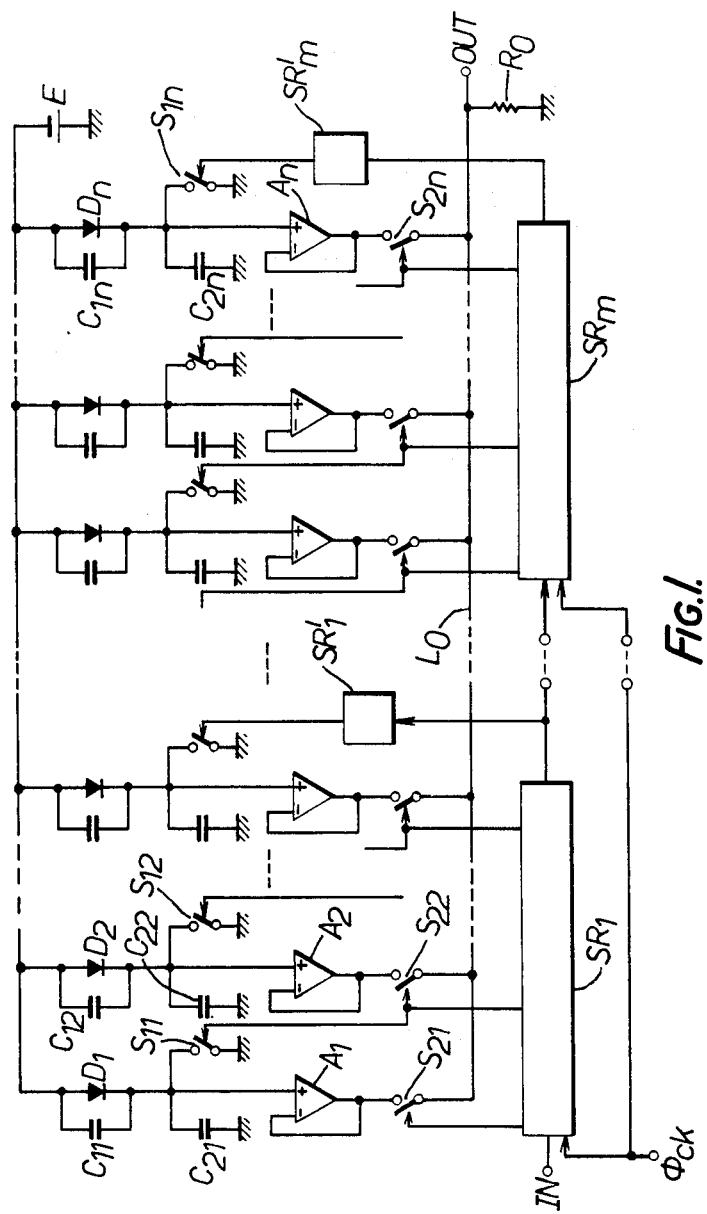
FIG. 1 is a circuit diagram of an image sensing device according to the present invention.

Referring now to the drawings, wherein like reference numerals designate identical or corresponding parts throughout the several views, and more particularly to FIG. 1 thereof, which shows a circuit diagram of an image sensor according to the present invention, it is seen that one end of each of the photovoltaic conversion elements D1-Dn is connected to a drive power source E, and the other end in each case is connected to a respective pre-amplifier A1-An. In this example, the pre-amplifiers A1-An are differential amplifiers having high input impedance and low output impedance. The output signals of the photovoltaic conversion elements D1-Dn are fed back as respective inputs to the non-inverting input terminals of the pre-amplifiers A1-An, such that the inverting input terminals are directly coupled to the output terminals. Respective reset switches S11–S1n are connected between ground and the non-inverting input terminals of the pre-amplifiers A1–An.

The output terminals of the pre-amplifiers A1–An are connected to switching elements S21–S2n for signal reading. The reset switches S11–S1n and switching elements S21–S2n are driven by shift registers SR (SR1,SR1'–SRm,SRm'). SR1–SRm are n/m stage shift registers, and SR1'–SRm' are single-stage shift registers. The switching elements S21–S2n are connected to the common output line LO and the common output line LO is grounded through the output resistance RO and connected to the output terminal OUT.

In this circuit, the pre-amplifiers A1–An, reset switches S11–S1n, and signal reading switching elements S21–S2n are grouped in n/m arrangements, and corresponding shift registers SR1,SR1'–SRm,SRm' are formed on m integrated circuits.

In the above configuration, the photovoltaic conversion elements D1–Dn generate photocurrents in response to the amount of incident light and these are accumulated for a certain time by capacitances C11–C1n and C21–C2n as signal charges. The voltages generated by the signal charges accumulated by capacitances C11–C1n and C21–C2n are amplified by the pre-amplifiers A1–An. The shift registers SR1–SRm receive as input data a logic "1" in the first stage, SR1, every time a line is read. This is transferred by the transfer clock $\phi$ck, thereby sequentially driving the switching elements S21–S2n. The reset switches S11–S1n are also sequentially driven, with a lag of one clock phase from the switching elements S21–S2n. Thus the output signal from the pre-amplifiers A1–An is sequentially read through the switching elements S21–S2n, and fed as the image reading output to the output terminal OUT through the common output line LO. After this reading-out operation, the charges left in the capacitances C11–C1n and C21–C2n are discharged through the reset switches S11–S1n, to prepare for the next signal charge accumulation and reading-out.

In this case, the capacitances C11–C1n are the interelectrode capacitances of the photovoltaic conversion elements D1–Dn and the capacitances C21–C2n are stray capacitances of the conductive strips defining wiring patterns. Of these, the interelectrode capacitances C11–C1n will in general be constant, but the stray capacitances C21–C2n will in general be non-uniform, depending on differences in the length of the wiring. If the voltage generated in the capacitances C11–C1n and C21–C2n is represented by Vi, the current generated in the photovoltaic conversion elements D1–Dn as Ii, the signal charge accumulation time as Tst, the capacitances C11–C1n as C1i, and the capacitances C21–C2n as C2i, then Vi is given by $$Vi = Ii \cdot Tst/(C1i + C2i)$$

(where i = 1 to n).

If therefore the wiring stray capacitances C21–C2n (C2i) are non-uniform, Vi will be different for the same amount of incident light, causing unevenness in the sensitivity of image reading. This invention is therefore aimed at making the stray capacitances C21–C2n of the conductive strips constant, or making the sums of the stray capacitances C21–C2n and the interelectrode capacitances C11–C1n constant, as described hereinafter.

Figure 2A:
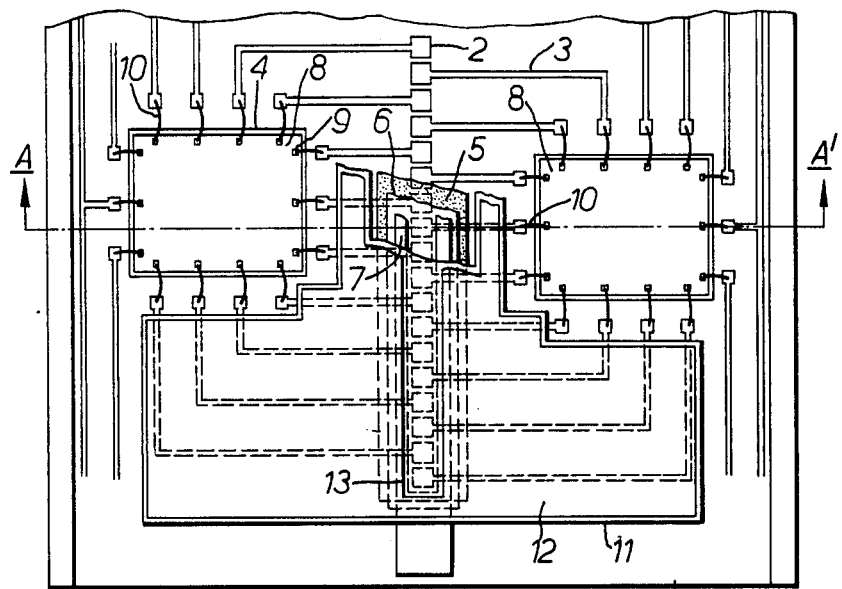
FIGS. 2 (a) and 2(b) are respectively a plan view of an embodiment of a sensing device according to the present invention and a cross-sectional view of this device along the line A-A' shown in FIG. 2(a)
Figure 2B:
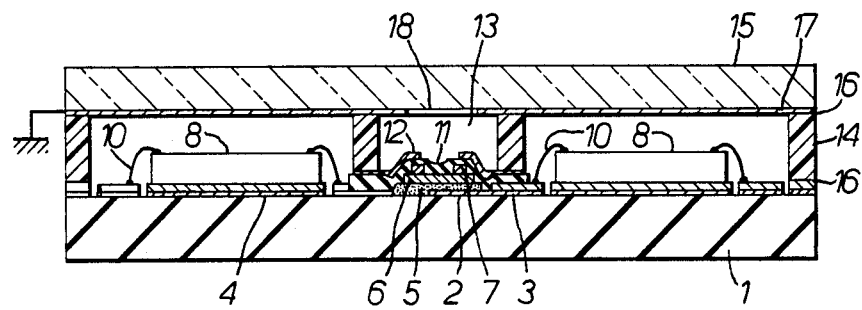

FIGS. 2(a) and 2(b) are respectively a plan view and a cross-sectional view along the line A–A' of an embodiment of the present invention in an image sensor of the circuit diagram ahown in FIG. 1.

In FIG. 2(a), the protective cap provided on top has been removed. In FIGS. 2(a) and 2(b), reference numeral 1 is for example a ceramic substrate, or a ceramic substrate formed with a glaze layer on top thereof. A plurality of lower electrodes 2 arranged in a row are formed in the middle of this ceramic substrate 1. There are also formed conductive strips 3 constituted by outgoing electrodes connected respectively on either side to each of the lower electrodes 2, on their left or on their right, with respect to the direction of the row. There is also formed a die bonding pad 4 for mounting an integrated circuit chip, to be described later. The lower electrodes 2 constitute one of the photovoltaic conversion elements D1–Dn in FIG. 1, and are formed for example by evaporating Cr onto the substrate 1 using photolithography and working to give the required shape. The conductive strips 3 and die bonding pattern 4 are formed in the same way as the lower electrodes 2. However, on the die bonding pad 4, and, excluding the neighborhood of the lower electrodes 2 on the conductive strips 3, there is deposited wire bonding for connection to the respective integrated circuit chip, and a bonding metal film consisting of Au/Cu etc. or an Au film on a Cr film, with the object of facilitating die bonding of the integrated circuit chip.

A photovoltaic conversion film 5 is provided consisting of a strip of amorphous Si formed for example by plasma CYD etc. so as to cover the lower electrodes 2 and the conductive strips 3 near to them. There is also provided a transparent electrode 6 formed by a method such as sputtering or spraying, for example ITO, onto the photovoltaic conversion film 5. The transparent electrode 6 corresponds to the common electrode in FIG. 1 that connects the photovoltaic conversion elements D1–Dn and the power source E. An opaque electrically conductive film 7 consisting, for example, of an evaporated Ti film is formed at locations on this transparent electrode 6 corresponding to the portions where the conductive strips 3 and photovoltaic conversion film 5 are in contact. This opaque electrically conductive film 7 is to ensure that the light is only incident on the photovoltaic conversion film 5 over the lower electrodes 2. It also performs the function of improving the electrical conductivity of the transparent electrode 6.

The integrated circuits 8 are mounted on the die bonding pad 4. The connection terminals 9 on these integrated circuits 8 and wire bonding pads provided at the ends of the conductive strips 3 are connected by means of wires 10. The integrated circuits 8 consist of assemblies of circuits such as the reset switches S11–S1n that constitute the signal reading circuit that reads the signal from the photovoltaic conversion elements D1–Dn in FIG. 1, the pre-amplifiers A1–An, the signal reading switching elements S21–S2n, and shift registers SR1–SRm.

A transparent insulating film 11 consisting of, for example, $Si_3N_4$ is deposited by sputtering or the like, so as to cover practically the entire surface of the substrate 1, with the exception of the integrated circuit 8. On this transparent insulating film 11 there is formed an opaque electrically conductive film 12 consisting of an evaporated film of Ti or Cr, etc., having a slit 13 to allow the light to strike the photovoltaic conversion film 5 on the lower electrodes 2.

Onto the substrate 1 on which all these various elements are provided, there is fitted a protective cap 15 formed of transparent glass sheet, by means of a spacer 14 formed of, for example, an opaque resin moulding. A thermosetting resin or UV setting resin can be used as the adhesive 16 for joining the spacer 14 and the pattern on the substrate 1, and for joining the spacer 14 and the propective cap 15. However, if the substrate 1 is transparent so that UV light can be applied through the substrate 1, the joining and fixing may be achieved in a shorter time using a UV setting resin and without the expansion of the gas inside, which would result from heating. An opaque electrically conductive film 17 having a light transmission window 18 in the region facing the photovoltaic conversion portion is deposited on the inside face of the protective cap 15. A metal evaporated film, for example, may be used for this opaque conductive film 17. Mask evaporation or ordinary photolithographic techniques may be used for forming the light transmission window 18. The process may be further simplified by using a tape of tacky metallic foil for the opaque conductive film 17. Yet a further simplification can be achieved by forming the spacer 14 and protective cap 15 integrally of a resin material, instead of forming them of separate materials. It is advantageous, in order to reduce the noise in image sensing devices, which generally are in a high impedance condition, to protect the sensing device from noise induced from outside by connecting the opaque conductive film 17 to ground potential or to the source potential E, as shown in FIG. 2(a).

Figure 3:
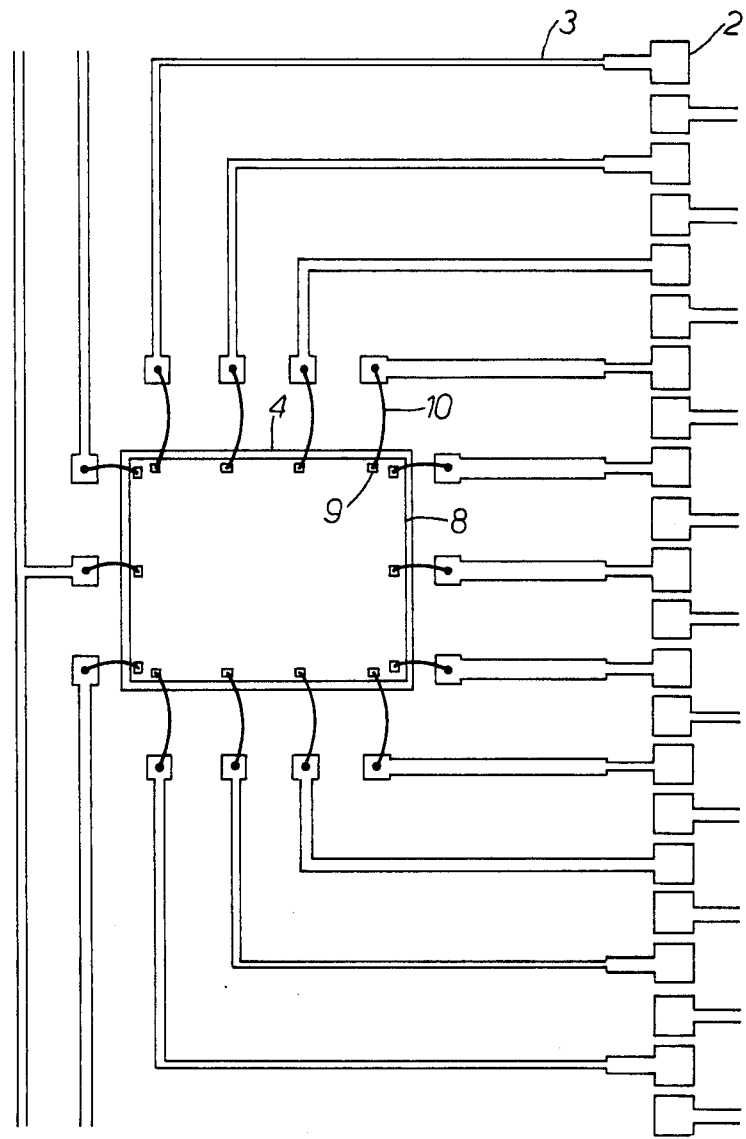
FIG. 3 is a plan view showing in detail the configuration of the conductive strips defining wiring patterns in FIG. 2(a)

In an image sensing device constructed as above described, the stray capacitance is made uniform by decreasing the width of the longer conductive strips 3, with the amount of the decrease being related to their length, as shown in FIG. 3.

Figure 4A:
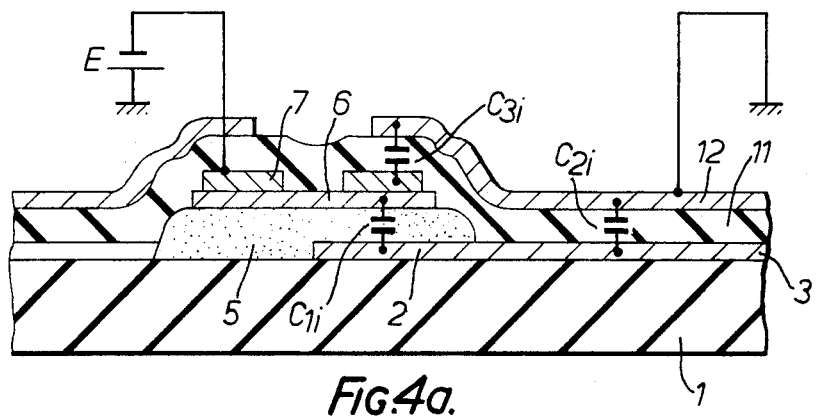
FIGS. 4(a) and 4(b) are respectively a cross-sectional view of major parts drawn to a larger scale of the sensing device of the invention, and an equivalent circuit diagram given in explanation of the stray capacitance equalization effect in the embodiment of FIGS. 2(a) and 2(e)
Figure 4B:
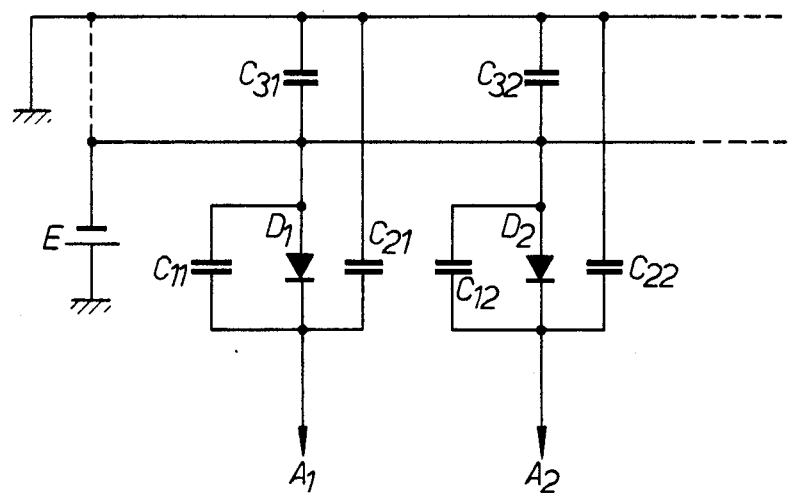

Specifically, the stray capacitance of strips 3 in this example mainly consists of the capacitances C2i between the pattern and the opaque conductive film 12 which is arranged, as shown in FIGS. 4(a) and 4(b), above the conductive strips 3 on the other side of the light-transmitting insulating film 11. These capacitances C2i are in parallel, through the power source E, with the inter-electrode capacitances C1i of the photovoltaic conversion elements Di (i.e. the capacitances between the lower electrodes 2 and light-transmitting electrode 6). Non-uniformity of these capacitances C2i is therefore undesirable, since it results in the amounts of the accumulated charge signals being non-uniform, causing instability of the image-reading sensitivity. In the zeroth order approximation, the stray capacitance C2i of each conductive strips 3 is determined by the area S of the conductive strip 3, the distance d between the conductive strip 3 and the opaque conductive film 12 (thickness of the transparent insulating film 11), and the permittivity $\epsilon$ of the dielectric material constituting the light-transmitting insulating film 11, and is therefore approximately given by:

$$C2i = \epsilon S/d$$

It is therefore possible to make the stray capacitance constant making S constant, which is accomplished by making the conductive strips 3 of longer length have narrower width and conductive strips 3 of shorter length have greater width. Such conductive strips of different widths can easily be produced by a method such as photolithography. In fact, as shown in FIGS. 4(a) and 4(b), there is also a capacitance C3i between the opaque conductive films 7 and the opaque conductive film 12, but if the opaque conductive film 12 is connected to ground potential, this capacitance C3i is in parallel with the power source E, so it does not affect the stray capacitance of the conductive strips 3.

Figure 5A:
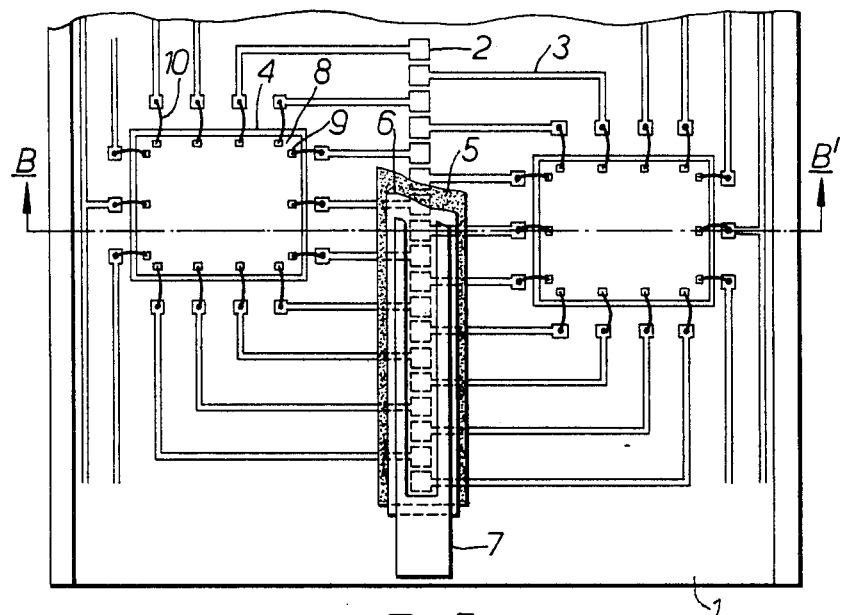
FIGS. 5(a) and 5(b) are respectively a plan view and a cross-sectional view along the line B-B' shown in FIG. 5(a) of a modified construction of an image sensing device of the present invention.
Figure 5B:
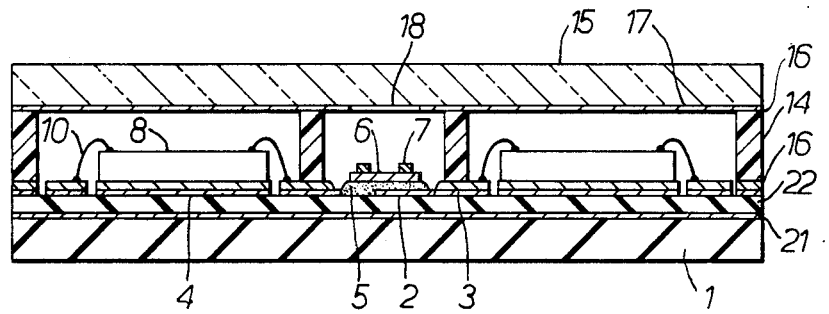

FIGS. 5(a) and 5(b) show a modified construction of the embodiment shown in FIGS. 2(a) and 2(b). In this construction, the light-transmitting insulating film 11 and opaque conductive film 12 are removed, and replaced by formation of a conductive film 21 on the substrate 1 and an insulating layer 22 on this conductive film 21. As in FIGS. 2(a) and 2(b), lower electrodes 2, conductive strips 3, and die bonding pad 4 are formed on this insulating layer 22. There are also formed in succession a photovoltaic conversion film 5, light-transmitting electrode 6 and opaque conductive film 7, and the integrated circuits 8 are mounted in position. In this case, the stray capacitance C2i of a conductive strip 3 is mainly the capacitance between it and the conductive film 21 on the substrate 1, which is arranged opposite to the conductive strip 3 on the other side of the insulating layer 22. However, as in the preceding construction, the respective stray capacitances can be made uniform by making the conductive strips 3 of greater length narrower, the extent of the narrowing being related to the length of the strips.

As explained above, in conductive strips that connect integrated circuits constituting signal reading circuits with photovotaic conversion elements, these strips being of unequal length, with this embodiment the stray capacitances can be made uniform by making the longer strips narrower, the extent of the narrowing being related to their length. This makes it possible to obtain a uniform image reading sensitivity for all the photovoltaic conversion elements, enabling a high-quality reading output to be obtained without sensitivity instability.

Figure 6A:
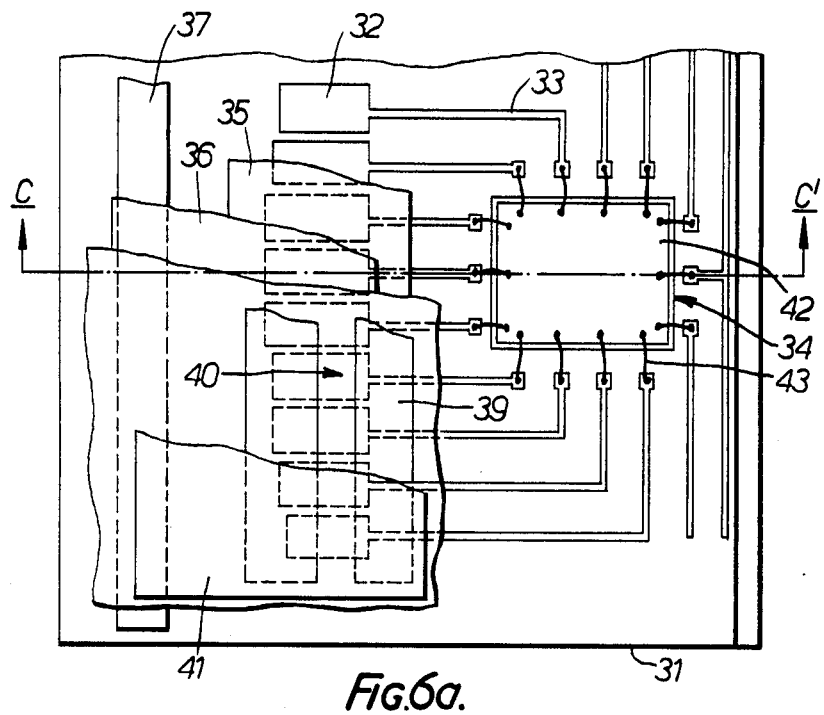
FIGS. 6(a) and 6(b) are respectively a plan view and a cross-sectional view taken along the line C-C' shown in FIG. 6(a) of the construction of a sensing device according to another embodiment of the present invention.
Figure 6B:
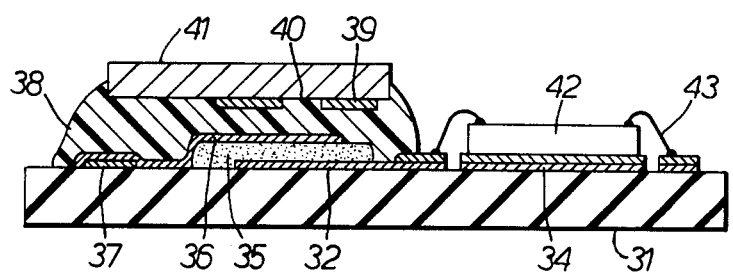

FIGS. 6(a) and 6(b) show another embodiment of the present invention.

In FIGS. 6(a) and 6(b), numeral 31 designates a glass substrate or a ceramic substrate formed with a glaze layer on its surface. A plurality of separate electrodes 32 are formed in a row on this substrate 31. The substrate is also formed with conductive strips 33 constituting outgoing electrodes connected to each of these separate electrodes 32, and with a die bonding pad 34 for mounting integrated circuit chips, to be described. These separate electrodes 32 constitute respectively one of the pairs of opposed electrodes of the photovoltaic conversion elements D1–Dn in FIG. 1. They may be formed, for example by evaporating a Cr layer onto the substrate 31 and then working the Cr layer to the required configuration using photolithographic techniques. The conductive strips 33 and die bonding pad 34 are formed in the same way as the separate electrodes 32. However, on the die bonding pad 34 and portions on the conductive strips 33 excluding the neighborhood of the separate electrodes 32, there is deposited a metallic bonding film formed of Au or Au/C film etc. on the Cr film. The purpose of this metallic bonding film is to facilitate die bonding of the integrated circuit chips and wire bonding for connection to the respective integrated circuit chips.

A strip-shaped photovoltaic conversion layer 35 consisting of amorphous Si is formed by, for example, the plasma CVD method so as to cover the separate electrodes 32 and the respective conductive strips 33 in the vicinity of electrodes 32. In addition, on top of the photovoltaic conversion layer 35, there is formed a strip-shaped light-transmitting electrode 36, made, for example, by sputtering or spraying an ITO film. The light-transmitting electrode 36 constitutes the other electrode of the aforementioned opposed electrodes, and is connected to a common electrode 37 that connects the power source E and the photovoltaic conversion elements D1-Dn in FIG. 1. An opaque layer 39 formed of, for example, an evaporated Ti film is provided on the other side of the light-transmitting resin layer 38 at positions corresponding to the regions where the photovoltaic conversion layer 35 and conductive strips 33 on the light-transmitting electrodes 36 are in contact. The opaque layer 39 is formed on the surface of a light-transmitting plate 41, for example, a glass plate, which is stuck on by means of light-transmitting resin 38, and is provided with slits 40 that transmit light so that the light is only incident in a photovoltaic conversion element region of the photovoltaic conversion layer 35, which region has a predetermined width and area above the separate electrodes 32.

The integrated circuit chip 42 is mounted on the die bonding pad 34. The connection terminals on this integrated circuit chip 42 and the wire bonding pads which are provided at the end of the conductive strips 33 are connected by means of wires 43. The integrated circuit chip 42 in each case includes a plurality of reset switches S11-S1n constituting a signal reading circuit for reading the signals from the photovoltaic conversion elements D1-Dn in FIG. 1, pre-amplifiers A1-An, switching elements S21-S2n for signal reading, and shift registers SR1-SRm, etc. In an image sensor constructed as above, the conductive strips 33 that make the connections with the integrated circuit chip 42 will be of various lengths. In consideration of the fact that, of the opposed electrodes that are formed sandwiching the photovoltaic conversion layer 35, the one which is actually divided into a plurality of electrodes, viz., the separate electrodes 32, is connected to the conductive strips 33, in this embodiment, the sums of the stray capacitances of the conductive strips 33 with the interelectrode capacitances of the photovoltaic conversion elements are made uniform by making the areas of these separate electrodes 32 larger in the cases of those connected to the shorter conductive strips 33, the amount of the increase in the areas being progressively related to the lengths of the conductive strips.

Specifically, if the widths of the conductive strips 33 and their pitch are constant, the stray capacitances C2i of the conductive strips 33 are proportional to the wiring length. Now the interelectrode capacitances C1i of the photovoltaic conversion elements are determined by the area S of the electrodes, the distance between the electrodes (distance between the separate electrodes 32 and the light-transmitting electrode 36) d, and the permittivity between the electrodes (permittivity of the photovoltaic conversion layer 35) $\epsilon$, being essentially given by $$C1i = \epsilon S/d$$

If therefore the area S of a separate electrode 32 is altered, the interelectrode capacitance will also be altered. It therefore is possible to make the the sum of the interelectrode capacitance C1i and stray capacitance C2i (C1i+C2i) uniform by making the areas of the separate electrodes 32 (specifically their lengths in the direction at right angles to their direction of division) different, corresponding to the wiring lengths of the conductive strips 33.

It should be noted that increase in the area exposed to the light, as a result of such variations of the areas of the separate electrodes 32, is prevented by means of the slits 40 of constant width of the opaque layer 39, so instability of the sensitivity does not occur.

As above described, according to the present invention, the capacitances that store the signal charge from the photovoltaic conversion elements are made uniform, so sensitivity instability of image reading can be much reduced and a high quality image having virtually no density instability can be reproduced.

The fact that in the above embodiment the photovoltaic conversion elements are completely cut off from the atmosphere by means of the light-transmitting plate 41 and light-transmitting resin 38, with the result that they are protected from moisture and impurities such as Na+ or Cl−, means that an image sensor of high reliability can be realized. It should be noted that the present invention is not restricted to the above embodiments but could be put into practice in various modified ways without departing from its essence. For example, in the embodiment shown in FIGS. 2(a) and 2(b), the stray capacitance of the conductive strips was exemplified by the capacitance between the conductive strip and the opaque conductive film on the side of the incoming light, or the capacitance between the conductive strip and the conductive film on the substrate side. However, this is merely one example, and the present invention could be applied in like manner to stray capacitances with respect to other conductors, depending on the construction. In case where the stray capacitance of the integrated circuit connection terminals is not negligible, the sums of the stray capacitances of the conductive strips and the connection terminals connected to them can be made uniform by decreasing the areas of these connection terminals in proportion to the lengths of the conductive strips to which they are connected. The embodiment shown in FIGS. 2(a) and 2(b) has been described with reference to an image sensor in which the conductive strips (outgoing electrodes) were arranged to the left or to the right on either side of the row direction of the lower electrodes. However, the present invention could of course be applied to an image sensor wherein the conductive strips defining wiring patterns are formed on one side only of the row direction of the lower electrodes.

Furthermore, whereas in the embodiment shown in FIGS. 6(a) and 6(b), the opaque layer 39 constituting the means for restricting incidence of light onto the photovoltaic conversion layer is arranged on the other side of the light-transmitting resin layer 38, the opaque layer 39 could be applied directly to the light-transmitting electrode 36. Although in the embodiment wherein the opposed electrodes sandwich the photovoltaic conversion layer, the electrode that is divided into a plurality of electrodes (separate electrodes 32) is provided on the substrate 31, it would also be possible to provide a common electrode (corresponding to the light-transmitting electrode 36 in this embodiment) on the substrate 31, and arrange separate light-transmitting electrodes above it, on the other side of the photovoltaic conversion layer. In this case, the common electrode would not have to be light-transmitting. The invention could also be applied to an image sensor in which the light is incident from a substrate side, that is below the photovoltaic conversion layer, the substrate being made light-transmitting for this purpose.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An image sensing device comprising:
    a substrate;
    a plurality of photovoltaic conversion elements formed as an array on said substrate for converting incident light from an image plane to be read into electrical signals, each said photovoltaic conversion element having opposed electrodes and a photovoltaic conversion layer therebetween;
    means for reading said electrical signals converted by said photovoltaic conversion elements;
    a plurality of conductive strips defining wiring patterns formed on said substrate, each conductive strip having a first end connected to one of said electrodes of said photovoltaic conversion elements and a second end connected to said reading means; and
    each said conductive strip being dimensioned in relation to the respective electrode connected thereto such that each conductive strip and its respective electrode define a substantially equal value of capacitance.

2. An image sensing device according to claim 1, wherein said reading means comprises:
    a plurality of integrated circuits formed on said substrate, each integrated circuit including signal reading circuits that sequentially read said electrical signals converted by said photovoltaic conversion elements.

3. An image sensing device according to claim 1, wherein each conductive strip defines an area and each respective electrode defines an area, and further, wherein the sum of the area of each conductive strip plus the area of its respective electrode are substantially equal.

4. An image sensing device according to claim 3, wherein the areas of said respective electrodes are each equal, and wherein said conductive strips have predetermined lengths and widths, said width of each said conductive strip being narrower in inverse relationship to the length of said conductive strip, whereby the stray capacitances of the respective conductive strips are made substantially equal.

5. An image sensing device according to claim 3, wherein said conductive strips have equal widths and differing lengths; and wherein the electrodes respectively connected to said conductive strips have areas which increase in inverse relation to the length of said conductive strips, whereby each conductive strip defines a stray capacitance and each electrode defines an interelectrode capacitance and the sum of the stray capacitance of said conductive strip with the respective interelectrode capacitance of said electrode is substantially equal.

6. An image sensing device according to claim 3, further comprising:
    connection terminals for connecting said second end of each of said conductive strips to said reading means;
    said electrodes connected to respective ones of said conductive strips each having substantially the same area; and,
    wherein said conductive strips have widths which are made narrower and said connection terminals have areas which are made smaller in inverse relation to the wiring length of the respective conductive strip, said conductive strips defining stray capacitances and said connection terminals defining respective capacitances, wherein the sums of the stray capacitances of said conductive strips with the capacitances of the respective connection terminals are substantially equal.

7. An image sensing device according to claim 3, wherein said reading means comprises:
    a plurality of pre-amplifiers for amplifying the electrical signals from said photovoltaic conversion elements; and
    a predetermined number of selection means for sequentially selecting respective output signals of said preamplifiers.

8. An image sensing device according to claim 1, wherein said photovoltaic conversion elements comprises:
    a layer of amorphous silicon which generates an amount of electric charge corresponding to the amount of incident light.

9. An image sensing device according to claim 1, wherein said electrodes of said photovoltaic conversion elements comprise a plurality of separately divided electrodes connected to respective ones of said conductive strips.

10. An image sensing device according to claim 9, which further comprises a strip-shaped light-transmitting electrode formed over said separately divided electrodes.

11. An image sensing device according to claim 5, further comprising:
    incident light restriction means formed on each photovoltaic conversion element to limit the area of each photovoltaic conversion element which receives incident light to a constant, irrespective of the areas of the electrodes connected to said conductive strips.

12. An image sensing device according to claim 11, wherein each said incident light restriction means comprises:
    an opaque layer having constant width slits for transmitting light, said opaque layer formed on a side of each photovoltaic conversion element on which incident light impinges.

13. An image sensing device according to claim 12, wherein said incident light restriction means further comprises:
    a light-transmitting resin layer formed on said photovoltaic conversion element, and said opaque layer is formed on said light transmitting resin layer.

* * * * *